(12) United States Patent
Kao et al.

(10) Patent No.: US 6,425,191 B1
(45) Date of Patent: Jul. 30, 2002

(54) APPARATUS AND METHOD FOR REDUCING SOLVENT RESIDUE IN A SOLVENT-TYPE DRYER FOR SEMICONDUCTOR WAFERS

(75) Inventors: Rong-Hui Kao, Hsinchu; Ming-Dar Guo, Tainan; Jih-Churng Twu, Chung-Ho; Tsung-Chieh Tsai; Chia-Chun Cheng, both of Tainan, all of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/837,815

(22) Filed: Apr. 18, 2001

(51) Int. Cl.[7] ................................................. F26B 3/00
(52) U.S. Cl. .............................. 34/443; 34/469; 34/357; 34/201
(58) Field of Search .................... 34/443, 444, 452, 34/469, 72, 76, 201, 357

(56) References Cited

U.S. PATENT DOCUMENTS

| | | | | |
|---|---|---|---|---|
| 4,150,494 A | * | 4/1979 | Rothchild | 134/28 |
| 5,094,883 A | * | 3/1992 | Muzzy et al. | 264/131 |
| 6,026,588 A | * | 2/2000 | Clark et al. | 34/77 |

* cited by examiner

Primary Examiner—Jiping Lu
(74) Attorney, Agent, or Firm—Randy W. Tung

(57) ABSTRACT

An apparatus and a method for reducing solvent residue in a solvent-type dryer for drying semiconductor wafers have been disclosed. The apparatus is constructed by a tank body, a wafer carrier, an elevator means, a tank cover, a solvent vapor conduit and an exhaust means. The exhaust means is provided for fluid communication with a compartment in the tank cover such that any residual solvent vapor or any organic residue in the compartment left from the wafer drying cycle can be evacuated to a factory exhaust system. The present invention novel method for reducing solvent or organic residue in the dryer can be carried out, after the removal of the dried wafers from the dryer, by evacuating the compartment in the tank cover for a time period of between about 30 sec. and about 300 sec. until all residual solvent vapor or organic residue is evacuated.

18 Claims, 3 Drawing Sheets

APPARATUS AND METHOD FOR REDUCING SOLVENT RESIDUE IN A SOLVENT-TYPE DRYER FOR SEMICONDUCTOR WAFERS

FIELD OF THE INVENTION

The present invention generally relates to an apparatus and a method for drying semiconductor wafers in a solvent-type dryer and more particularly, relates to an apparatus and a method for reducing solvent residue in a solvent-type dryer after a drying cycle for semiconductor wafers is completed by incorporating an exhaust system in the dryer.

BACKGROUND OF THE INVENTION

In the fabrication of semiconductor devices, a large quantity of deionized (DI) water is frequently used to clean wafers in a wet bench process. For instance, when residual chemical must be removed from the surface of a wafer, DI water rinse is used in the wet bench process to perform major wafer cleaning operations such as quick-dump-rinse and cascade overflow rinse. It is desirable that the surface of the wafer be cleaned by DI water after a chemical or polishing process has been conducted on the wafer, i.e. oxide or nitride deposition, etching or chemical mechanical polishing process. The wet bench wafer cleaning step can be accomplished by equipment that is installed either in-line or in a batch-type process.

A typical automated wafer scrubber combines brush and solution scrubbing by DI water. The scrubber utilizes a hyperbolic high-pressure spray of DI water with a retractable cleaning brush. A typical wafer scrubbing process consists of a DI water spray step followed by a spin dry and nitrogen gas blow dry step. More recently, the solvent drying technology such as the use of isopropyl alcohol (IPA) has been developed to further improve the drying technology.

In a solvent drying technology, such as one that utilizes IPA shown in FIG. 1, the drying process is conducted in a static manner or with the wafer positioned statically without movement. The wafer drying 10 is constructed of a drying tank 12 constructed with a wafer receptacle 14, a chiller 16, a sidewall heater 18 and a bottom heater 20. A cleaned and wet wafer is transported into the drying tank 12, or the vapor chamber. A vapor of IPA is transported into the chamber cavity 22 by a carrier gas such as a high purity nitrogen, or any other high purity inert gas. The vapor enters into cavity 22 is then heated by the bottom heater 20 such that IPA is further vaporized and rises into the cavity 22. The wafer 24 is surrounded by the IPA vapor and, due to the high volatility of IPA, water on the wafer surface can be evaporated away without leaving any water mark, contaminating particles or metal particles. The vapor pressure of IPA can be suitably adjusted such that there is a steady flow of IPA vapor in the cavity 22 fed from the IPA reservoir tank 26.

In the conventional IPA drying tank 10 shown in FIG. 1, the only moving part for transferring wafers into and out of the chamber cavity is a robot arm. There are no other moving parts which can produce contaminating particles. The IPA drying chamber can thus be kept in an extremely clean condition to avoid any contamination of the wafer surface. To further maintain the cleanliness of the chamber cavity 22, an air filter 28 is utilized for filtering incoming air into the cavity 22 and for providing a suitable flow rate of the IPA vapor. After the cleaning process is completed, the water-containing IPA vapor is condensed by the chiller 16 into IPA liquid and is collected at the bottom of the drying chamber 12 for recycling and reuse by the process. The IPA vapor drying process is normally controlled by three major elements, i.e. the purity and the water content of IPA; the flow rate and flow speed of the IPA vapor; and the cleanliness of the IPA vapor.

An improved solvent drying technique has been proposed in recent years which is similar in principal to that described above. In a Maragoni dryer, the drying principal is based on the different surface tensions of IPA and DI water. The different surface tensions cause the ejection of water molecules from the wafer surface which are then collected by a reservoir in the drying apparatus. The Maragoni drying process is carried out by slowly withdrawing a wafer from a DI water tank immersed in DI water. At the same time, IPA vapor carried by $N_2$ carrier gas is flown onto the wet wafer surface such that IPA is saturated on the exposed wafer surface above the water level. Since the concentration of IPA on the surface of the exposed wafer is larger than the concentration of DI water, the surface tension of IPA is smaller than the surface tension of water in the water tank. This causes the water molecules on the surface of the exposed wafer to be retracted into the water tank and thus achieving the drying purpose.

A typical Maragoni dryer 40 is shown in FIG. 2. The Maragoni dryer 40 is constructed by an upper chamber section 52, a lower chamber section 44 which is also an outer tank, an inner tank 42 for holding a volume of DI water 62 therein, a drain conduit 50 in fluid communication with the outer chamber 44, a wafer carrier 46 for carrying a plurality of semiconductor wafers 60, an elevator means 48 for raising and lowering the wafer carrier 46 into and out of the volume of DI water 62, and a tank cover, or lid member 54. The outer tank 44 is formed by a tank wall 68 defining a cavity 56 therein for receiving an overflow of DI water 62 from the inner tank 42 when the wafer cassette 46 is lowered into the volume of DI water 62. The inner tank 42 is defined by sidewall 72 for holding the volume of DI water 62 therein. A cavity 58 is formed when the wafer carrier 46 is lowered into the volume of DI water 62 and the tank cover 54 is slid over the top of the inner tank 42 forming a hermetically sealed chamber.

A wafer drying process. typically can be carried out in the Maragoni dryer 40 in the following manner. First, the wafer carrier 46, together with the plurality of wafers 60, i.e. as many as 50 wafers, are first immersed in the volume of DI water 62 for rinsing the wafers and for removing any residual processing chemicals which may have been left on the wafer surface. After a soaking time of approximately between 1 and 2 min., a drying cycle of approximately 10 min. is carried out. In the first part of the drying cycle, instead of only nitrogen gas being flown into the chamber cavity 58 during the DI water soaking cycle, additional amounts of IPA vapor is flown into the chamber cavity 58 through a multiplicity of apertures 64 provided in a lower compartment wall 66 of a compartment 70. These are shown in FIGS. 3A and 3B of a top view and a side view of tank cover 54, respectively. At the end of the Part 1 drying cycle, the DI water 62 is drained out of the inner tank 42. During the Part 1 of the drying cycle, the wafer carrier 46, together with the plurality of wafers 60, are slowly raised out of the volume of DI water 62 and thus a Maragoni drying process is conducted by the saturated IPA vapor.

In the second part of the drying cycle, which takes only about 60 sec., the flow of IPA vapor into the tank cavity 58 is stopped such that only nitrogen is flown into the tank cavity 58. The DI water 62 is completely drained out of the inner tank 42, such that the wafer carrier 46 and the plurality of wafers 60 in their dried state can be lowered into the empty inner tank 42. The tank cover 54 is then slid to the side (as shown in FIG. 2) to allow access to the wafer carrier 46 after it is moved up by the elevator means. The plurality of wafers 60 is then removed by robot means (not shown) and thus, the Maragoni drying process is completed.

Also shown in FIGS. 3A and 3B are a solvent vapor dispersing conduit 74 and a plurality of partition plates 76 to allow a more uniform distribution of the solvent vapor into the tank cavity 58 during the Maragoni drying process.

While the Maragoni drying process has been satisfactorily utilized in drying semiconductor wafers, certain drawbacks of the process do exist. One of the drawbacks is that the flow of solvent vapor into the drying tank cavity frequently carriers an electrostatic charge. The electrostatic charge as evidenced by negative OH ions is generated when the solvent vapor flows through a solvent vapor delivery tube that is frequently fabricated of an electrostatic charge-inducing plastic material. Moreover, the tank cover itself, into which the solvent vapor delivery tube is mounted, and the partition plates which are attached to the tank cover may also be fabricated of a plastic material that causes the formation of electrostatic charges in the solvent vapor that flows therethrough. The electrostatic charges carried by the solvent vapor may be transferred to the wafer surface when the solvent vapor is impinged onto the wafer and thus causing serious silicon pitting or silicon hole defects on the wafer surface. Such defects, when occurring at a high frequency, may cause a silicon wafer to be scrapped. The attack on the silicon wafer surface by electrostatic charges must therefore be prevented or eliminated.

In a Maragoni drying process, it was discovered that the wafer positioned in slot 25 tends to have the most severe effect caused by any defect condition in the process or in the equipment. As shown in Table I, Test No. 1 was conducted with the bath filled with DI water, however, no Maragoni drying process was conducted, i.e. the wafers were not exposed to alcohol vapor. It is seen that the defect count is very low on wafers selected from three different slots, i.e. 1, 24 and 25. When the Maragoni drying process was conducted two times, as shown in Test No. 2, while the bath was empty with no water, the defect count went up drastically from the data obtained in Test No. 1. A similar Maragoni drying test was conducted in Test No. 3 with the Maragoni drying process carried out only once, the defect count is still very severe when compared to data obtained in Test No. 1. Test No. 4 was conducted under conditions similar to that used in Test No. 1, i.e. with no Maragoni drying process conducted. It is seen that the defect count is very low due to a lack of exposure of the bare wafer surface to alcohol, or to the organic vapor contributed by alcohol.

TABLE I

| Test No. | Condition | POD | Defect Count Slot 1 | Slot 24 | Slot 25 |
| --- | --- | --- | --- | --- | --- |
| 1 | All DIW bath (DIW filling) + no MG/D | 1 | 5 | 7 | 6 |
| 2 | Empty DIW bath (no water) + MG/D 2 times | 1 | 162 | 11 | 91 |
| 3 | Empty DIW bath (no water) + MG/D 1 time | 1 | 62 | 11 | 161 |
| 4 | Empty DIW bath (no water) + no MG/D | 1 | 13 | 9 | 18 |

TABLE I-continued

The experimental data shown in Table I suggests that the residual alcohol, or the organic residue left after a Maragoni drying process is the major cause of high defect count. The defects are shown as silicon holes in the bare silicon surface. When the defect count is higher than about 75, the wafer is considered as unacceptable for quality reasons. When the defect count is significantly higher than 75, the entire wafer may be scrapped when the defects are silicon holes. Ideally, the defect count on the bare silicon wafer should be less than 40 for the wafer to pass satisfactorily during quality control.

It is therefore an object of the present invention to provide an apparatus for drying semiconductor wafers that do not have the drawbacks or shortcomings of the conventional solvent-type dryers.

It is another object of the present invention to provide an apparatus for reducing solvent residue in a solvent-type dryer for semiconductor wafers to eliminate silicon pitting and silicon hole defect.

It is a further object of the present invention to provide an apparatus for reducing solvent residue in a solvent-type dryer for semiconductor wafers wherein the presence of solvent residue in the dryer after a drying cycle is completed can be substantially eliminated.

It is another further object of the present invention to provide an apparatus for reducing solvent residue in a solvent-type dryer for semiconductor wafers that is equipped with an exhaust system connected to a factory exhaust conduit.

It is still another object of the present invention to provide an apparatus for reducing solvent residue in a solvent-type dryer for semiconductor wafers that incorporates an exhaust system in fluid communication with an exhaust pump.

It is yet another object of the present invention to provide a method for reducing solvent residue in a solvent-type dryer for semiconductor wafers in which the organic residue from a solvent that is present in the dryer after a drying cycle is completed can be significantly reduced.

It is still another further object of the present invention to provide a method for reducing solvent residue in a solvent-type dryer for semiconductor wafers that is carried out by an additional step of withdrawing solvent vapor residue from a compartment in a tank cover after each drying cycle is completed.

It is yet another further object of the present invention to provide a method for reducing solvent residue in a solvent-type dryer for semiconductor wafers by incorporating a withdrawing step from the dryer for the solvent residue after each drying cycle is completed for a time period of at least 30 sec.

SUMMARY OF THE INVENTION

In accordance with the present invention, an apparatus and a method for reducing solvent residue in a solvent-type dryer for semiconductor wafers by incorporating an exhaust system in the dryer are provided.

In a preferred embodiment, a solvent-type dryer for semiconductor wafers is provided which includes a tank body that has a cavity therein for holding a volume of water in a lower portion of the cavity; a wafer carrier for holding a plurality of wafers therein; an elevator means for lowering and raising the wafer carrier into and out of the volume of water in the tank body; a tank cover for covering an open top of the tank body which has a compartment therein for receiving a solvent vapor from a conduit, the compartment has a plurality of apertures in fluid communication with the cavity of the tank body for dispersing the solvent vapor into the tank body; a conduit for feeding a solvent vapor into the compartment; and an exhaust means in fluid communication with the compartment in the tank cover for exhausting residual solvent vapor from the compartment after each wafer drying cycle.

In the solvent-type dryer for semiconductor wafers, the conduit may be in fluid communication with both a solvent vapor reservoir and an inert gas reservoir. The compartment may further include a dispersion plate that has a plurality of apertures therein for dispersing solvent vapor into the cavity in the tank body. The exhaust means may include a factory exhaust conduit, or an exhaust pump. The conduit may further include a multiplicity of apertures for dispersing a solvent vapor/inert gas mixture into the compartment. The conduit may further include a multiplicity of apertures for dispersing a mixture of isopropyl alcohol vapor and nitrogen into the compartment. The tank cover may further include at least two conduits providing fluid communication between the compartment and the exhaust means, or three conduits for providing fluid communication between the compartment and the exhaust means.

The present invention is further directed to a method for reducing solvent residue in a solvent-type dryer for semiconductor wafers which can be carried out by the operating steps of first providing a solvent-type dryer that includes a tank body, a wafer carrier and an elevator means; providing a tank cover that has a compartment therein for receiving a solvent vapor and for dispersing the vapor into the tank body, the tank cover further includes an exhaust means in fluid communication with the compartment; conducting a solvent drying process in the tank body by flowing a solvent vapor onto a plurality of wafers carried in the wafer carrier; removing the plurality of wafers from the tank body; and withdrawing solvent vapor residue from the compartment by the exhaust means.

The method for reducing solvent residue in a solvent-type dryer for semiconductor wafers may further include the step of refilling the tank body with a volume of deionized water during the withdrawing step, or the step of withdrawing solvent vapor residue from the compartment for a time period of at least 30 sec., or the step of withdrawing solvent vapor residue from the compartment for a time period between about 30 and about 300 sec. The method may further include the step of withdrawing solvent vapor residue from the compartment by a factory exhaust conduit, or by an exhaust pump. The method may further include the step of withdrawing solvent vapor residue from the compartment through at least two exhaust conduits in fluid communication with the exhaust means. The method may further include the step of conducting the solvent drying process by flowing isopropyl alcohol vapor onto the plurality of wafers carried in the wafer carrier, or the step of conducting the solvent drying process by flowing a mixture of isopropyl alcohol vapor/nitrogen gas onto the plurality of wafers carried in the wafer carrier.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
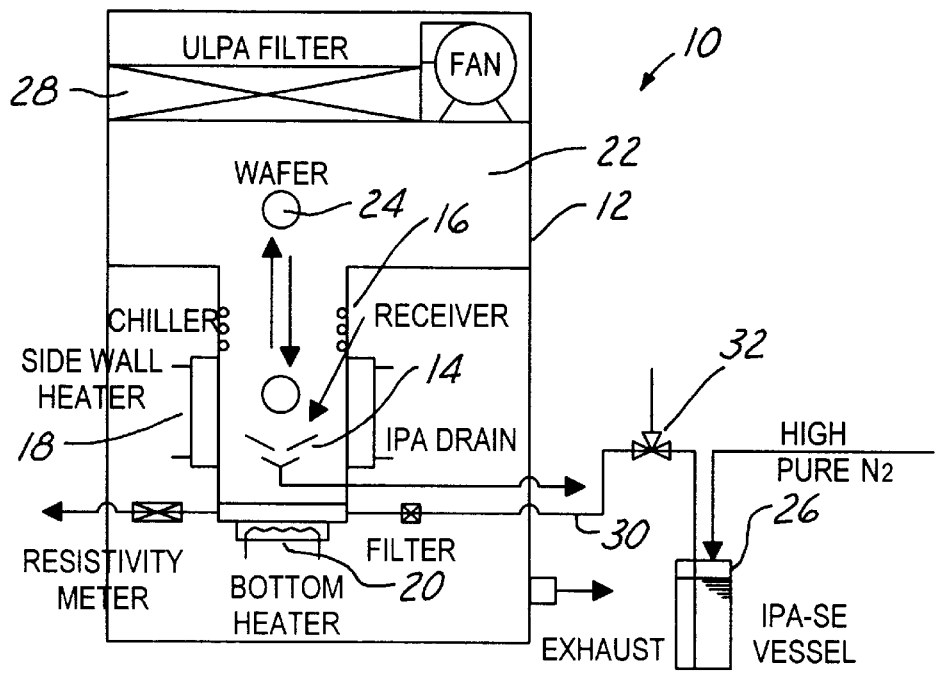
FIG. 1 is a cross-sectional view of a conventional solvent-type dryer for drying semiconductor wafers after a wet bench process.
Figure 2:
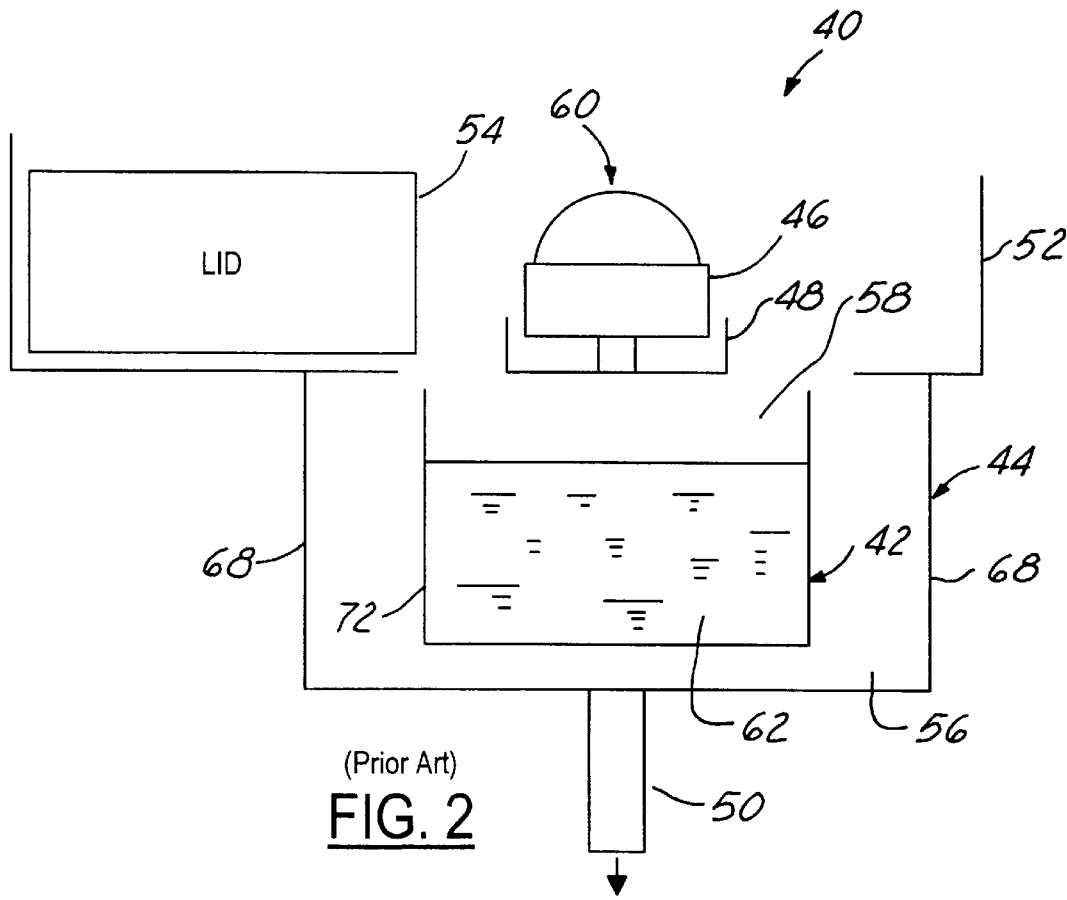
FIG. 2 is a simplified, cross-sectional view of a conventional Maragoni dryer.

The present invention discloses an apparatus and a method for reducing solvent residue, i.e. organic residue, in a solvent-type dryer for drying semiconductor wafers after a wet bench process.

The apparatus of a solvent-type dryer of the present invention for drying semiconductor wafers can be constructed of a tank body, a wafer carrier, an elevator means, a tank cover, a solvent vapor conduit, and an exhaust means in fluid communication with the tank cover. The tank body may have a cavity therein for holding a volume of DI water in a lower portion of the cavity, while the wafer carrier is adapted for holding a plurality of wafers, i.e. as many as 50 wafers therein. The elevator means is adapted for lowering and raising the wafer carrier into and out of the volume of DI water in the tank body. The tank cover is equipped with a compartment for receiving a solvent vapor and for dispersing through a plurality of apertures the solvent vapor into the tank body for carrying. out the drying process. The solvent vapor conduit may further include a multiplicity of apertures such that the solvent vapor/inert gas can be better mixed and dispersed into the compartment in the tank cover. The exhaust means that is in fluid communication with the compartment in the tank cover effectively exhausts residual solvent vapor from the compartment after each wafer drying cycle is completed.

The exhaust means utilized in the invention novel apparatus may further include a factory exhaust conduit or an exhaust pump.

The invention further discloses a method for reducing solvent or organic residue in a solvent-type dryer for semiconductor wafers which can be carried out by the steps of first providing a solvent-type dryer that is equipped with a tank body, a wafer carrier and an elevator means; then providing a tank cover that has a compartment therein for receiving a solvent vapor and for dispersing the vapor into the tank body, the tank cover further includes an exhaust means in fluid communication with the compartment; conducting a solvent drying process in the tank body by flowing a solvent vapor onto a plurality of wafers carried in the wafer carrier; removing the plurality of wafers from the tank body; and withdrawing solvent vapor residue from the compartment by the exhaust means.

The present invention novel apparatus and method can effectively and significantly reduce the solvent residue, or organic residue in a solvent-type dryer after wafers have been dried in the dryer by operating an exhaust system for a time period of at least 30 sec., or preferably, for a time period of between about 30 sec. and about 300 sec. The exhaust means may be suitably connected to a factory exhaust conduit which has a negative pressure and controlled by a valve means for opening or closing the exhaust means. The exhaust means can further be connected to an exhaust pump which operates at a desirable negative pressure for more efficient removal of the solvent or organic vapor from the compartment in the tank cover.

While the present invention novel apparatus and method have been designed specifically for a Maragoni dryer, the apparatus and method can be equally applied to any other solvent-type dryers used for drying semiconductor wafers after a wet bench process.

The present invention novel method can further be supplemented by an inert gas purging step after a DI water washing step for the-tank cover of the Maragoni dryer is completed.

A cleaning schedule for use in a fabrication plant for the solvent-type dryer can be followed by incorporating DI washing and inert gas purging steps to further supplement the present invention method by utilizing the exhaust means. For instance, the solvent residue issue can be reduced or eliminated after each wafer drying cycle by flowing a low DI water flow into the dryer for washing the internal components of the dryer and then flowing an inert gas, such as nitrogen into the dryer for-purging and drying. The present invention novel method may further be incorporated in a periodic maintenance procedure by flowing a large DI water flow into the dryer to flush down the interior components of the dryer and then flowing a large flow of nitrogen gas into the dryer to purge and dry the interior components of the system. These cleaning procedures can be advantageously used together with the present invention exhaust method for pumping away any residual solvent or organic residue in the tank cover of the dryer.

By reducing the solvent residue, such as the isopropyl alcohol residue in the dryer, i.e. on the interior components of the dryer, the silicon pitting defect and the silicon hole formation can be significantly reduced.

Figure 4A:
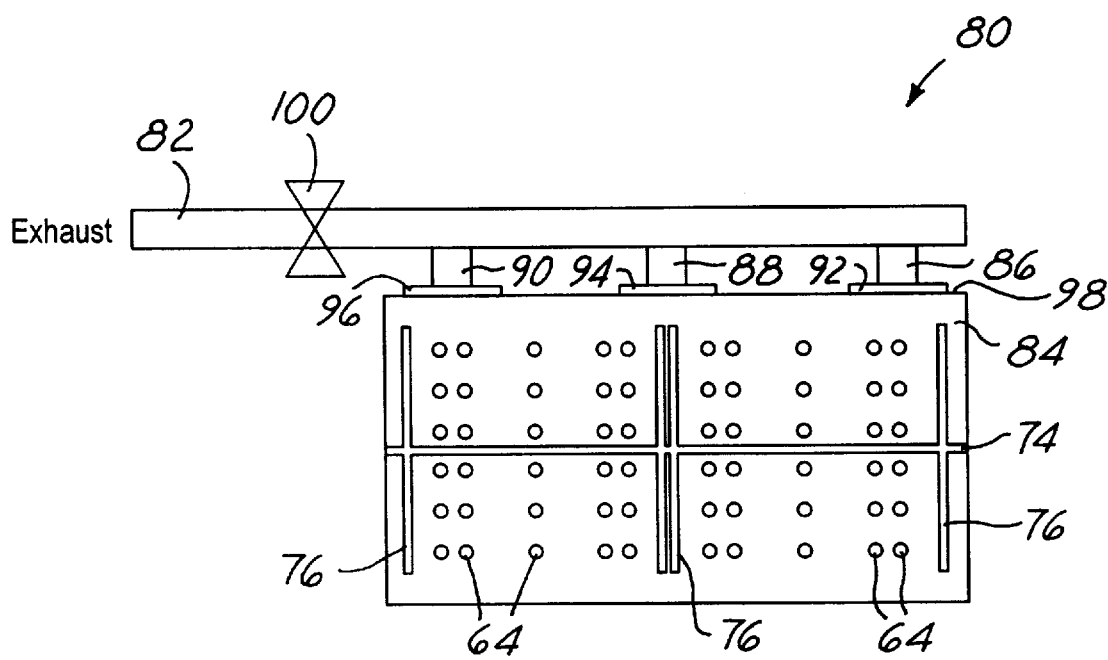
FIG. 4A is a top view of the present invention solvent-type dryer showing the tank cover equipped with an exhaust means.
Figure 4B:
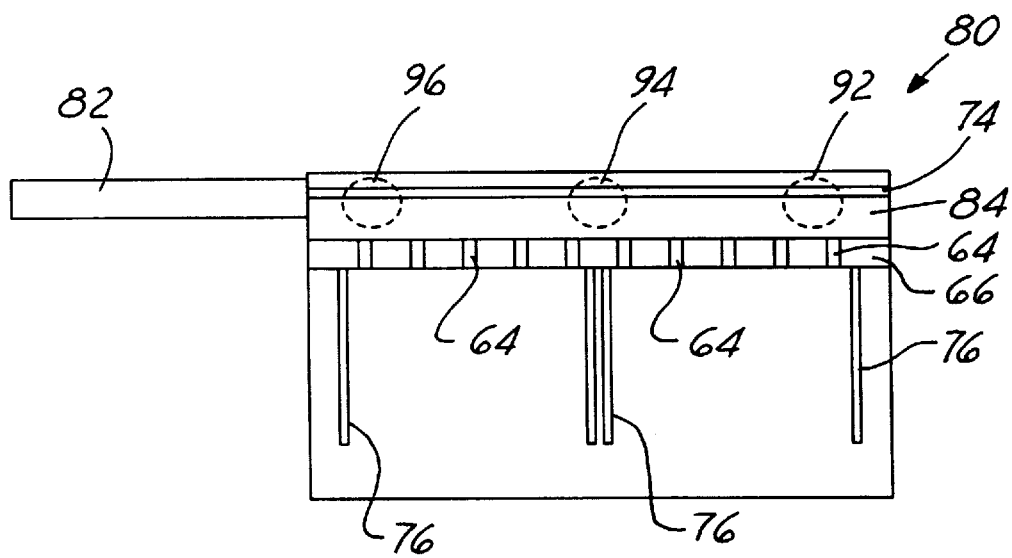
FIG. 4B is a side view of the present invention tank cover incorporating an exhaust means.

The present invention novel apparatus is shown in FIG. 4A in a top view, and in FIG. 4B in a side view. The present invention tank cover 80 is equipped with an exhaust conduit 82 that is in fluid communication with compartment 84 inside the tank cover 80 through a plurality of fluid conduits 86,88 and 90. Each one of the fluid conduits 86,88 and 90 is provided with a flange portion 92,94 and 96 for connecting to the sidewall 98 of the tank cover 80. It should be noted that three separate conduits 86,88 and 90 are provided in the preferred embodiment shown in FIG. 4A. However, any other suitable number of the fluid conduit can be utilized as long as a rapid evacuation of the tank cover cavity 84 can be achieved in a short period of time, i.e. in about 60 sec. This is desirable so that the fabrication yield of the wafer drying process is not affected. The flow of the residual solvent through the exhaust conduit 82 is controlled by valve 100 which may be an on/off valve. The valve 100 is not shown in FIG. 4B for simplicity reason.

Figure 3A:
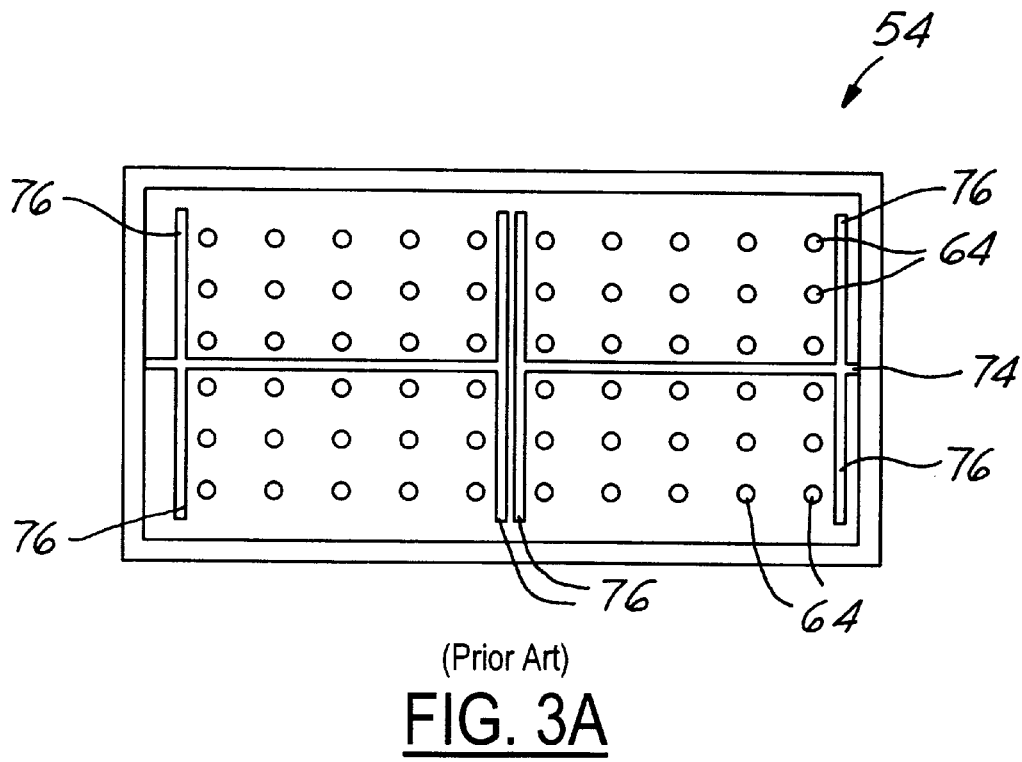
FIG. 3A is a top view of the tank cover of the Maragoni dryer of FIG. 2.
Figure 3B:
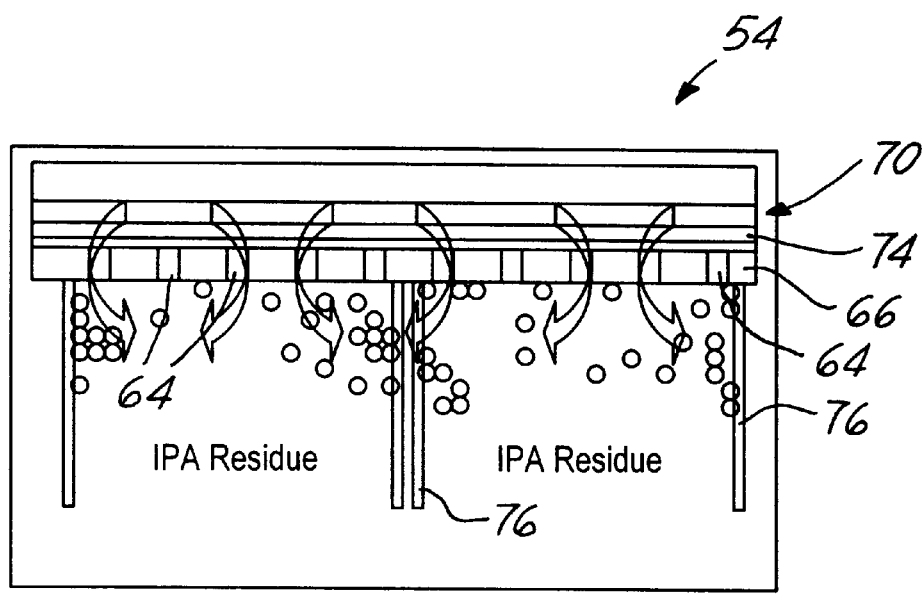
FIG. 3B is a cross-sectional view of the tank cover of the Maragoni dryer of FIG. 2.

Also shown in FIG. 4A, in a partially exploded manner, are the solvent vapor dispersion conduit 74, the plurality of partition plates 76 and the multiplicity of dispersing apertures 64 that are provided in a bottom plate 66 of the compartment 84 in the tank cover 80. The structure of the solvent vapor dispersing conduit 74, the plurality of partition plates 76 and the multiplicity of apertures 64 are similar to that previously described in FIGS. 3A and 3B.

The present invention novel method can be carried out by first conducting a typical drying process in the solvent-type dryer, then after wafers are removed from the drying tank, the compartment 84 of the tank cover 80 is evacuated by the exhaust conduit 82 through either a factory exhaust system or an exhaust pump (not shown). A suitable time period for the evacuation may be at least 30 sec. or between about 30 sec. and about 300 sec. Experimental results obtained by the present invention novel method indicate that at least 95 wt. % of the solvent residue, i.e. of isopropyl alcohol, can be removed from the tank cover, and to some extent, from the chamber cavity of the solvent-type dryer.

The present invention novel apparatus and method for reducing solvent residue, or -organic residue, in a solvent-type dryer for drying semiconductor wafers after a wet bench process by incorporating an exhaust system for the tank cover of the dryer have therefore been amply described in the above description and in the appended drawings of FIGS. 4A and 4B.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A solvent-type dryer for semiconductor wafers comprising:
   a tank body having a cavity therein for holding a volume of water in a lower portion of said cavity;
   a wafer carrier for holding a plurality of wafers;
   an elevator means for lowering and raising said wafer carrier into and out of said volume of water in said tank body;
   a tank cover for covering an open top of said tank body having a compartment therein for receiving a solvent vapor from a conduit, said compartment having a plurality of apertures in fluid communication with said cavity of said tank body for dispersing said solvent vapor into said tank body;
   a conduit for feeding a solvent vapor into said compartment; and
   an exhaust means in fluid communication with said compartment in said tank cover for exhausting residual solvent vapor from said compartment after each wafer drying cycle.

2. A solvent-type dryer for semiconductor wafers according to claim 1, wherein said conduit being in fluid communication with both a solvent vapor reservoir and an inert gas reservoir.

3. A solvent-type dryer for semiconductor wafers according to claim 1, wherein said compartment further comprises a dispersion plate having a plurality of apertures therein for dispersing solvent vapor into said cavity in the tank body.

4. A solvent-type dryer for semiconductor wafers according to claim 1, wherein said exhaust means comprises a factory exhaust conduit.

5. A solvent-type dryer for semiconductor wafers according to claim 1, wherein said exhaust means comprises an exhaust pump.

6. A solvent-type dryer for semiconductor wafers according to claim 1, wherein said conduit further comprises a multiplicity of apertures for dispersing a solvent vapor/inert gas mixture into said compartment.

7. A solvent-type dryer for semiconductor wafers according to claim 1, wherein said conduit further comprises a multiplicity of apertures for dispersing a mixture of isopropyl alcohol vapor and nitrogen into said compartment.

8. A solvent-type dryer for semiconductor wafers according to claim 1, wherein said tank cover further comprises at least two conduits providing fluid communication between said compartment and said exhaust means.

9. A solvent-type dryer for semiconductor wafers according to claim 1, wherein said tank cover further comprises three conduits providing fluid communication between said compartment and said-exhaust means.

10. A method for reducing solvent residue in a solvent-type dryer for semiconductor wafers comprising the steps of:

providing a solvent-type dryer comprising a tank body, a wafer carrier and an elevator means;

providing a tank cover having a compartment therein for receiving a solvent vapor and for dispersing said vapor into said tank body, said tank cover further comprises an exhaust means in fluid communication with said compartment;

conducting a solvent drying process in said tank body by flowing a solvent vapor onto a plurality of wafers carried in said wafer carrier;

removing said plurality of wafers from said tank body; and withdrawing solvent vapor residue from said compartment by said exhaust means.

11. A method for reducing solvent residue in a solvent-type dryer for semiconductor wafers according to claim 10 further comprising the step of refilling said tank body with a volume of deionized water during said withdrawing step.

12. A method for reducing solvent residue in a solvent-type dryer for semiconductor wafers according to claim 10 further comprising the step of withdrawing solvent vapor residue from said compartment for a time period-of at least 30 sec.

13. A method for reducing solvent residue in a solvent-type dryer for semiconductor wafers according to claim 10 further comprising the step of withdrawing solvent vapor residue from said compartment for a time period between about 30 and about 300 sec.

14. A method-for reducing solvent residue in a solvent-type dryer for semiconductor wafers according to claim 10 further comprising the step of withdrawing solvent vapor residue from said compartment by a factory exhaust conduit.

15. A method for reducing solvent residue in a solvent-type dryer for semiconductor wafers according to claim 10 further comprising the step of withdrawing solvent vapor residue from said compartment by an exhaust pump.

16. A method for reducing solvent residue in a solvent-type dryer for semiconductor wafers according to claim 10 further comprising the step of withdrawing solvent vapor residue from said compartment through at least two exhaust conduits in fluid communication with said exhaust means.

17. A method for reducing solvent residue in a solvent-type dryer for semiconductor wafers according to claim 10 further comprising the step of conducting said solvent drying process by flowing isopropyl alcohol vapor onto said plurality of wafers carried in said wafer carrier.

18. A method for reducing solvent residue in a solvent-type dryer for semiconductor wafers according to claim 10 further comprising the step of conducting said solvent drying process by flowing a mixture of isopropyl alcohol vapor/nitrogen gas onto said plurality of wafers carried in said wafer carrier.

* * * * *